(12) United States Patent
Bal et al.

(10) Patent No.: US 11,901,919 B2
(45) Date of Patent: Feb. 13, 2024

(54) ON CHIP TEST ARCHITECTURE FOR CONTINUOUS TIME DELTA SIGMA ANALOG-TO-DIGITAL CONVERTER

(71) Applicant: STMicroelectronics International N.V., Geneva (CH)

(72) Inventors: Ankur Bal, Greater Noida (IN); Abhishek Jain, Delhi (IN); Sharad Gupta, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/723,225

(22) Filed: Apr. 18, 2022

(65) Prior Publication Data

US 2022/0345149 A1 Oct. 27, 2022

Related U.S. Application Data

(60) Provisional application No. 63/179,964, filed on Apr. 26, 2021.

(51) Int. Cl.
 *H03M 3/00* (2006.01)
(52) U.S. Cl.
 CPC ............. *H03M 3/378* (2013.01); *H03M 3/46* (2013.01); *H03M 3/496* (2013.01)
(58) Field of Classification Search
 CPC ......... H03M 3/46; H03M 3/496; H03M 3/378
 See application file for complete search history.

(56) References Cited

U.S. PATENT DOCUMENTS

| | | | |
|---|---|---|---|
| 5,257,026 A | 10/1993 | Thompson et al. | |
| 5,561,600 A * | 10/1996 | McCombie | G01M 15/11 |
| | | | 123/436 |
| 5,585,802 A * | 12/1996 | Cabler | G10H 1/125 |
| | | | 377/42 |
| 9,048,861 B2 | 6/2015 | Schuurmans | |
| RE45,798 E | 11/2015 | Thomas et al. | |
| 9,350,380 B2 | 5/2016 | Chen | |
| 9,350,381 B1 | 5/2016 | Doare et al. | |

(Continued)

FOREIGN PATENT DOCUMENTS

EP 1916771 B1 12/2009

OTHER PUBLICATIONS

Chouba et al., "A BIST Architecture for Sigma Delta ADC Testing Based on Embedded NOEB Self-Test and CORDIC Algorithm," International Conference on Design & Technology of Integrated Systems in Nanoscale Era, 2010, 7 pages.

(Continued)

*Primary Examiner* — Lam T Mai
(74) *Attorney, Agent, or Firm* — Seed IP Law Group LLP (57) ABSTRACT

An integrated circuit includes a continuous time delta sigma analog-to-digital converter (CTDS ADC) and a test circuit for testing the CTDS ADC. The test circuit converts multi-bit digital reference data to a single-bit digital stream. The test circuit then passes the single-bit digital stream to a finite impulse response digital-to-analog converter (FIR DAC). The FIR DAC converts the single-bit digital stream to an analog test signal. The analog test signal is then passed to the CTDS ADC. The CTDS ADC converts the analog test signal to digital test data. The test circuit analyzes the digital test data to determine the accuracy of the CTDS ADC.

22 Claims, 6 Drawing Sheets

(56) References Cited

U.S. PATENT DOCUMENTS

| | | |
|---|---|---|
| 9,401,728 B2 | 7/2016 | Doare et al. |
| 9,780,803 B1 | 10/2017 | Bal et al. |
| 10,581,447 B1 * | 3/2020 | Gambini ................. H03M 1/66 |

OTHER PUBLICATIONS

Nagaraj et al., "8 Bit Second-Order Continuous-Time Band-Pass Sigma-Delta ADC," *International Journal of Innovative Technology and Exploring Engineering (IJITEE)*, 3(1): 106-111, Jun. 2013.

Ong et al., "Delta-sigma Modulator Based Mixed-signal BIST Architecture for SoC," Department of Electrical and Computer Engineering, University of California, Santa Barbara, CA, IEEE, 2003, pp. 669-674.

* cited by examiner

ON CHIP TEST ARCHITECTURE FOR CONTINUOUS TIME DELTA SIGMA ANALOG-TO-DIGITAL CONVERTER

BACKGROUND

Technical Field

The present disclosure is related to integrated circuits, and more particularly to testing analog-to-digital converters in integrated circuits.

Description of the Related Art

A system on-chip (SoC) is a single integrated circuit having a number of functional subsystems. The subsystems can include microcontrollers, memory arrays, digital-to-analog converters (DAC), analog-to-digital converters (ADC), digital signal processors (DSP) and various other subsystems or blocks.

Testing mixed-signal subsystems typically relies on functional specification testing. Functional specification testing uses specialized automated test equipment (ATE) for applying appropriate test stimuli, retrieving the output responses, and processing the test results. However, in a complex SoC or system in package (SiP) in which external access to the internal subsystems is difficult, or directly impossible, testing operations may be very challenging to perform in an efficient manner. In some cases, the cost of testing mixed signal subsystems may be the dominant contribution to the overall manufacturing cost. The testing of certain types of ADCs can be particularly difficult.

BRIEF SUMMARY

Embodiments of the present disclosure provide an efficient and effective test circuit for testing a continuous time delta sigma (CTDS) ADC. The test circuit and the CTDS ADC are part of an integrated circuit. The test circuit generates an analog test signal for testing the ADC. The test circuit utilizes the analog test signal to test the accuracy or functionality of the CTDS ADC.

The test circuit stores multibit digital reference data corresponding to an over sampled analog reference signal. The test circuit generates the analog test signal by converting the multibit digital reference data to a single bit data stream and then passing the single bit data stream to a finite impulse response (FIR) DAC. The FIR DAC converts the single bit data stream to the analog test signal.

In one embodiment, the FIR DAC includes a plurality of individual single bit digital-to-analog converters. The output of each single bit digital-to-analog converter is summed by a plurality of summers. The output of a final summer is the analog test signal.

The test circuit provides the analog test signal to the CTDS ADC. The CTDS ADC converts the analog test signal to a digital test signal. The test circuit then compares the digital test signal to the digital reference data. The test circuit determines the accuracy of the CTDS ADC based on the comparison of the digital test signal to the digital reference data.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known algorithms associated with facial recognition, facial detection, and facial authentication have not been shown or described in detail, to avoid unnecessarily obscuring descriptions of the embodiments. Further, well-known components and circuits associated with memory arrays have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
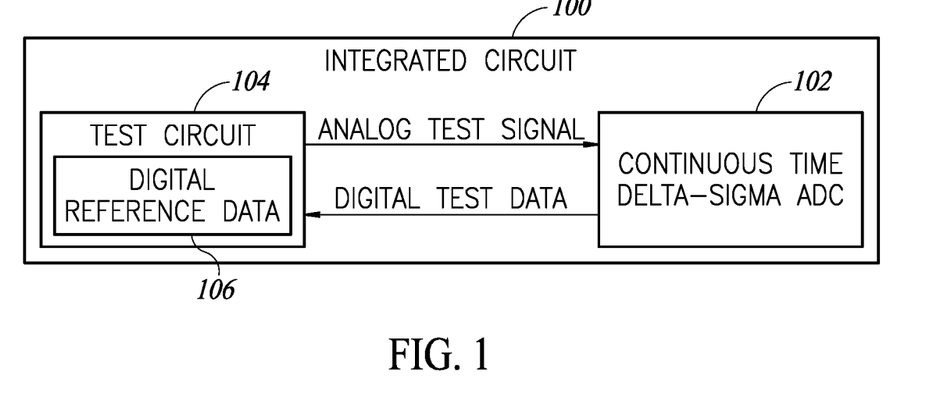
FIG. 1 is a block diagram of an integrated circuit, according to one embodiment.

FIG. 1 is a block diagram of an integrated circuit 100, according to one embodiment. The integrated circuit 100 includes a continuous time delta sigma (CTDS) ADC 102 and a test circuit 104. As will be set forth in more detail below, the test circuit 104 effectively and efficiently tests the accuracy of the CTDS ADC 102.

The integrated circuit 100 may be an SOC. Accordingly, the integrated circuit 100 may include many other subsystems aside from the CTDS ADC 102 and the test circuit 104. For example, the integrated circuit 100 may include one or more microcontrollers, memory arrays, DACs, DSPs, or other subsystems. All these may be implemented within the integrated circuit 100. Alternatively, in some embodiments, the integrated circuit 100 may be part of an SIP that includes multiple integrated circuits in a single package. The integrated circuit 100 may be one of the multiple integrated circuits within the SIP.

The CTDS ADC 102 receives analog signals and converts the analog signals to digital signals. The CTDS ADC 102 can be utilized in a large variety of applications including image processing, sound processing, wireless signal processing, and many other types of applications. In an example in which the integrated circuit 100 is a SOC, the CTDS ADC 102 may be utilized to perform analog-to-digital conversion on analog signals generated from within the integrated circuit 100 or on analog signals received from a source external to the integrated circuit 100.

One way in which Delta Sigma ADCs differ from other types of ADCs is that Delta Sigma ADCs sample the input analog signal at a frequency much higher than the Nyquist frequency. Traditionally, the Nyquist frequency is double the frequency of the input signal. For example, if an input signal has a frequency of 1 MHz, then the Nyquist frequency is 2 MHz. Delta Sigma ADCs may sample the input analog signal at a rate that is more than five times higher than the Nyquist frequency. Other types of ADCs, such as successive approximation register (SAR) ADCs may sample the input analog signal at a frequency much closer to the Nyquist frequency.

Delta Sigma ADCs can be divided into two broad groups: discrete time delta sigma (DTDS) ADCs and CTDS ADCs. Both DTDS and CTDS ADCs include a loop filter that receives the input analog signal. The loop filter passes the input analog signal to a quantizer. The loop filter or more, depending, in part, on an oversampling ratio (OSR) of the modulator is a discrete time loop filter. The DTDS ADC samples the analog input signal prior to the loop filter and, thus, is a discrete time sampler. The CTDS ADC may sample the input analog signal after the discrete time loop filter thus, the CTDS ADC is a continuous time ADC. There may be other components, configurations, and differences between DTDS ADCs and CTDS ADCs.

Upon startup of the integrated circuit 100, it is beneficial to test the CTDS ADC 102. In order to test the CTDS ADC 102, an analog test signal is provided to the CTDS ADC 102. The CTDS ADC 102 converts the analog test signal to a digital test signal. The characteristics of the digital test signal are checked to determine the accuracy of the CTDS ADC 102.

It can be very difficult to generate, on chip, an analog test signal for testing an ADC. While it may be simple to generate an analog test signal off-chip for testing an ADC, generating an analog test signal off chip is cumbersome and expensive in that a device other than the integrated circuit of which the ADC is part is utilized in testing the ADC. It is desirable to generate an analog test signal on-chip to avoid utilizing external devices or circuits in testing the ADC each time an integrated circuit is started up. There may be solutions for generating analog test signals on-chip for various types of ADCs, possibly even for DTDS ADCs. However, it is notoriously difficult to generate an analog test signal on-chip for a CTDS ADC.

The integrated circuit 100 effectively and efficiently generates an analog test signal with the test circuit 104. The test circuit 104 is part of the integrated circuit 100. The test circuit 104 generates an analog test signal for testing the CTDS ADC 102. Because the test circuit 104 is part of the integrated circuit 100, the test circuit 104 generates the analog test signal on chip. The test circuit 104 may be a built-in self-test (BIST) system.

The test circuit 104 generates the analog test signal and provides the analog test signal to the CTDS ADC 102. The CTDS ADC 102 receives the analog test signal at the input of the CTDS ADC 102. The CTDS ADC 102 converts the analog test signal to digital test data. The CTDS ADC 102 passes the digital test data to the test circuit 104.

The test circuit 104 determines the accuracy or functionality of the CTDS ADC 102 based on the digital test data. In particular, the test circuit 104 analyzes the digital test data. The test circuit 104 may compare the digital test data to reference data stored in the test circuit 104. Alternatively, the test circuit 104 may determine the accuracy of the CTDS ADC 102 based on other types of analysis of the digital test data.

In one embodiment, the test circuit 104 stores digital reference data 106. The digital reference data 106 represents a digitized version of an analog reference signal. The test circuit 104 generates the analog test signal from the digital reference data 106. Because the digital reference data 106 is stored in the integrated circuit 100, the analog test signal can be generated on-chip from the digital reference data 106.

In one embodiment, the analog reference signal is a sine wave. Accordingly, the digital reference data 106 is initially generated by performing an analog-to-digital conversion on the analog reference signal. The digital reference data 106 is loaded onto the integrated circuit 100 for use in testing the CTDS ADC 102. In some examples described herein, the analog reference signal is a sine wave. However, the analog reference signal can have waveforms other than sine wave without departing from the scope of the present disclosure. The digital reference data 106 corresponds to a digital representation of whatever analog waveform is utilized for the analog reference signal.

The digital reference data 106 may correspond to an over sampled digital representation of the analog reference signal. For example, if the analog reference signal is a 5 MHz signal, then the digital reference data 106 may be generated by sampling the analog reference signal of the sampling rate of 50 MHz to 100 MHz or more, depending, in part, on an oversampling ratio (OSR) of the modulator. This corresponds to sampling at 5-10 times or more the Nyquist rate associated with the analog reference signal. Each sample or data value of the digital reference data 106 is a multibit value. In one example, each sample in the digital reference data 106 is 8-16 bits, though other values can be utilized without departing from the scope of the present disclosure.

In one embodiment, the test circuit 104 includes a Delta Sigma modulator. When testing the CTDS ADC 102, the digital reference data 106 is passed to the Delta Sigma modulator of the test circuit 104. The Delta Sigma modulator converts the digital reference data 106 to a single bit digital stream. The single bit digital stream is a series of pulses. Each pulse has a value of either 0 or 1. The number of pulses per second is much higher (equal to oversampling frequency) than the sampling rate associated with the digital reference data 106. For example, the single bit digital stream may have a bit rate greater than 1 GHz in order to represent the digital reference data 106 and a single bit digital stream.

In one embodiment, the test circuit 104 includes a digital ROM. The single bit digital stream is stored in the digital ROM. The digital ROM outputs the single bit stream to other circuit components of the test circuit 104.

In one embodiment, the test circuit 104 includes a finite impulse response digital-to-analog converter (FIR DAC). The FIR DAC receives the single bit stream from the digital ROM. The FIR DAC converts the single bit digital stream into the analog test signal. The FIR DAC provides the analog test signal to the CTDS ADC 102.

In one embodiment, the test circuit 104 includes a digital signal processor (DSP). The DSP receives the digital test data from the CTDS ADC 102. The DSP processes the digital test data in order to determine the performance of the CTDS ADC 102. The DSP can perform various digital signal processing techniques on the digital test data. The DSP may also effectively compare the digital test data to the digital reference data 106 in order to determine the performance, such as the signal to noise and distortion ratio (SNDR), the total harmonic distortion (THD), and the spurious-free dynamic range (SFDR) of the CTDS ADC 102.

Figure 2:
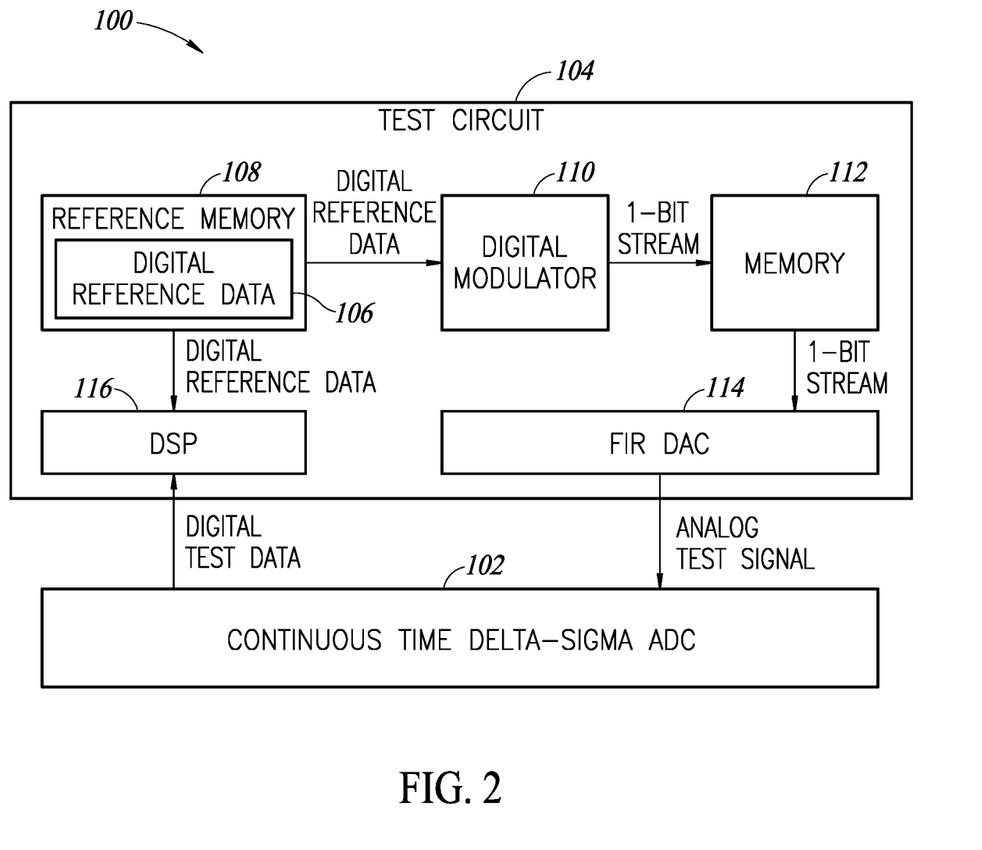
FIG. 2 is a block diagram of an integrated circuit, according to one embodiment.

FIG. 2 is a block diagram of an integrated circuit 100, according to one embodiment. The integrated circuit 100 includes a test circuit 104 and a CTDS ADC 102. The CTDS ADC 102 performs conversions of analog signals to digital signals. The test circuit 104 tests the CTDS ADC 102 upon startup of the integrated circuit 100 or in other circumstances.

The test circuit 104 includes a reference memory 108. The reference memory 108 stores digital reference data 106. The reference memory 108 can include a read-only memory, an electrically programmable read-only memory, and an electrically erasable and programmable read-only memory, or other types of computer memory suitable for storing digital reference data 106.

The digital reference data 106 is utilized as reference data for testing the CTDS ADC 102. The digital reference data 106 corresponds to a digital representation of an analog reference signal. The analog reference signal can include a sine wave or other analog waveforms. The digital reference data 106 is generated by performing an analog-to-digital conversion on the analog reference signal. The digital reference data 106 is then stored in the reference memory 108. The digital reference data 106 can be utilized for testing the CTDS ADC 102 each time the integrated circuit 100 is started up. Accordingly, once the digital reference data 106 is stored in the reference memory 108, the digital reference data 106 can be utilized to test the CTDS ADC 102 throughout the life of the integrated circuit 100.

As described previously, the digital reference data 106 may correspond to an over sampled digital representation of the analog reference signal. For example, if the analog reference signal is a 5 MHz signal, then the digital reference data 106 may be generated by sampling the analog reference signal at a sampling rate of 50 MHz to 100 MHz or more. This corresponds to sampling at 5-10 times the Nyquist frequency associated with the analog reference signal. Each sample or data value of the digital reference data 106 is a multibit value. In one example, each sample in the digital reference data 106 is 8-16 bits, though other values can be utilized without departing from the scope of the present disclosure.

The test circuit 104 includes a digital modulator 110. The digital modulator 110 is communicatively coupled to the reference memory 108. The digital modulator 110 receives the digital reference data 106 from the reference memory 108. The digital modulator 110 assists in generating an analog test signal for testing the CTDS ADC 102. More particularly, the digital modulator 110 generates a single bit digital stream that is utilized to generate the analog test signal, as will be set forth in more detail below.

When testing the CTDS ADC 102, the digital reference data 106 is passed to the digital modulator 110 of the test circuit 104. The digital modulator 110 converts the digital reference data 106 to a single bit digital stream. The single bit digital stream is a series of pulses. Each pulse represents a binary value of 1. The spaces between pulses can represent binary values of 0. The number of pulses per second is much higher than the sampling rate associated with the digital reference data 106. For example, the single bit digital stream may have a bit rate greater than 1 GHz in order to represent the digital reference data 106 in a single bit digital stream.

The test circuit 104 includes a memory 112. The memory 112 is coupled to the digital modulator 110. The digital modulator 110 passes the single bit digital stream to the memory 112. The memory 112 stores the single bit digital stream.

The memory 112 can include a buffer that stores the single bit digital stream. The memory 112 can include a first in first out (FIFO) buffer that receives the single bit digital stream and outputs the data values of the single bit digital stream in the order received. The memory 112 can include static random access memory (SRAM), dynamic random access memory (DRAM), flash memory, a digital ROM, EPROM, EEPROM or other types of memory suitable for receiving, storing, and outputting the single bit digital stream.

The test circuit 104 includes a finite impulse response digital-to-analog converter (FIR DAC) 114. The FIR DAC 114 is communicatively coupled to the memory 112. The FIR DAC receives the single bit stream from the digital ROM. The FIR DAC converts the single bit digital stream into the analog test signal. The FIR DAC provides the analog test signal to the CTDS ADC 102.

The FIR DAC 114 can include a plurality of flip-flops connected in series and each receiving a common clock signal. A first flip-flop receives the single bit digital stream from the memory 112. On each clock cycle the first flip-flop outputs a next bit of the single bit digital stream to the second flip-flop of the series of flip-flops. The second flip-flop outputs likewise passes the bits of the single bit digital stream to the third flip-flop, and so forth. At a given moment in time, the output of the first flip-flop includes the nth value of the single bit digital stream, the output of the second flip-flop provides the n-1 value of the single bit digital stream, the output of the third flip-flop provides the n-2 value of the single bit digital stream.

The output of each flop is also connected to a respective single bit DAC. The single bit DAC converts the digital value at the output of the corresponding flip-flop to an analog value. Each single bit DAC is coupled to a respective summer. The summers are connected to each other in series. The first summer sums the outputs of the first and second single bit DACs. The second summer sums the output of the first summer and the output of the third single bit DAC, and so forth. The output of the final summer is the analog test signal.

The arrangement of flip-flops, single bit DACs, and summers act as a filter that filters out high-frequency signals. If there are m flip-flops, then the series connection of summers results in the analog test signal being an average of the m most recent values of the of the digital stream. The result is that higher frequency fluctuations in the digital stream are filtered out.

The analog test signal output from the FIR DAC 114 is a re-creation of the analog reference signal that was initially utilized to generate the digital reference data. As described previously, the frequency of the analog reference signal is significantly lower than the frequency or bit rate of the single bit digital stream. Accordingly, the FIR DAC 114 filters out higher frequency fluctuations resulting from generation of the single bit digital stream and outputs the analog test signal having only the lower frequency fluctuations or signal characteristics associated with the analog reference signal from which the digital reference data 106 was generated.

The CTDS ADC 102 is coupled to the FIR DAC 114. The CTDS ADC 102 receives the analog test signal from the FIR DAC 114. The CTDS ADC 102 performs an analog-to-digital conversion on the analog test signal. Accordingly, the CTDS ADC 102 generates digital test data from the analog test signal.

The circuit 104 includes a digital signal processor (DSP) 116. The DSP 116 is coupled to the CTDS ADC 102 and the reference memory 108. The DSP 116 receives the digital test data from the CTDS ADC 102. The DSP processes the digital test data in order to determine the accuracy of the CTDS ADC 102.

In one embodiment, the DSP 116 first performs a digital filtering process on the digital test data. The DSP 116 then performs a gain and offset normalization process. The DSP 116 then performs a phase alignment process to align the phase of the digital test data with the phase of the digital reference data. The DSP 116 then performs cross-correlation between the digital test signal and the digital reference data 106. The extent to which the digital test data matches the digital reference data 106 indicates the accuracy of the CTDS ADC 102.

Figure 3:
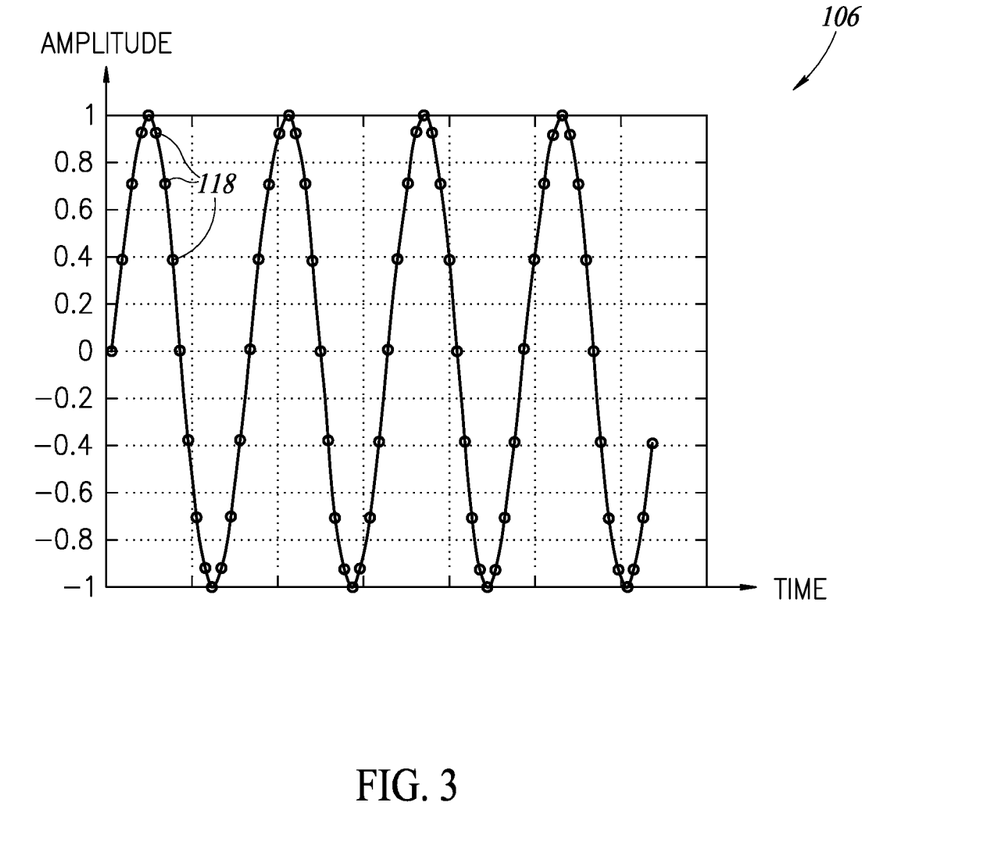
FIG. 3 is a graph illustrating digital reference data, according to one embodiment.

FIG. 3 is a graph illustrating the digital reference data 106, according to one embodiment. The digital reference data 106 includes a plurality of data values 118. Each data value 118 is a multibit data value. Each data value 118 may include 8 to 16 bits. In a particular example, each data value 118 includes 12 bits.

Each data value 118 corresponds to a sample of an analog reference signal. In the example of FIG. 3, the analog reference signal is a sine wave, as can be seen by the lines connecting the data values 118 of the digital reference data 106. In the example of FIG. 3, there are 15 data values for each cycle of the sine wave. If the Nyquist frequency is two samples per cycle of the sine wave, then the sample rate associated with the digital reference data 106 is 7.5 times the Nyquist frequency. In other words, the digital reference data 106 is a heavily over sampled representation of the original analog reference signal. Other analog waveforms, sampling rates, and bits per data value 118 can be utilized without departing from the scope of the present disclosure.

Figure 4:
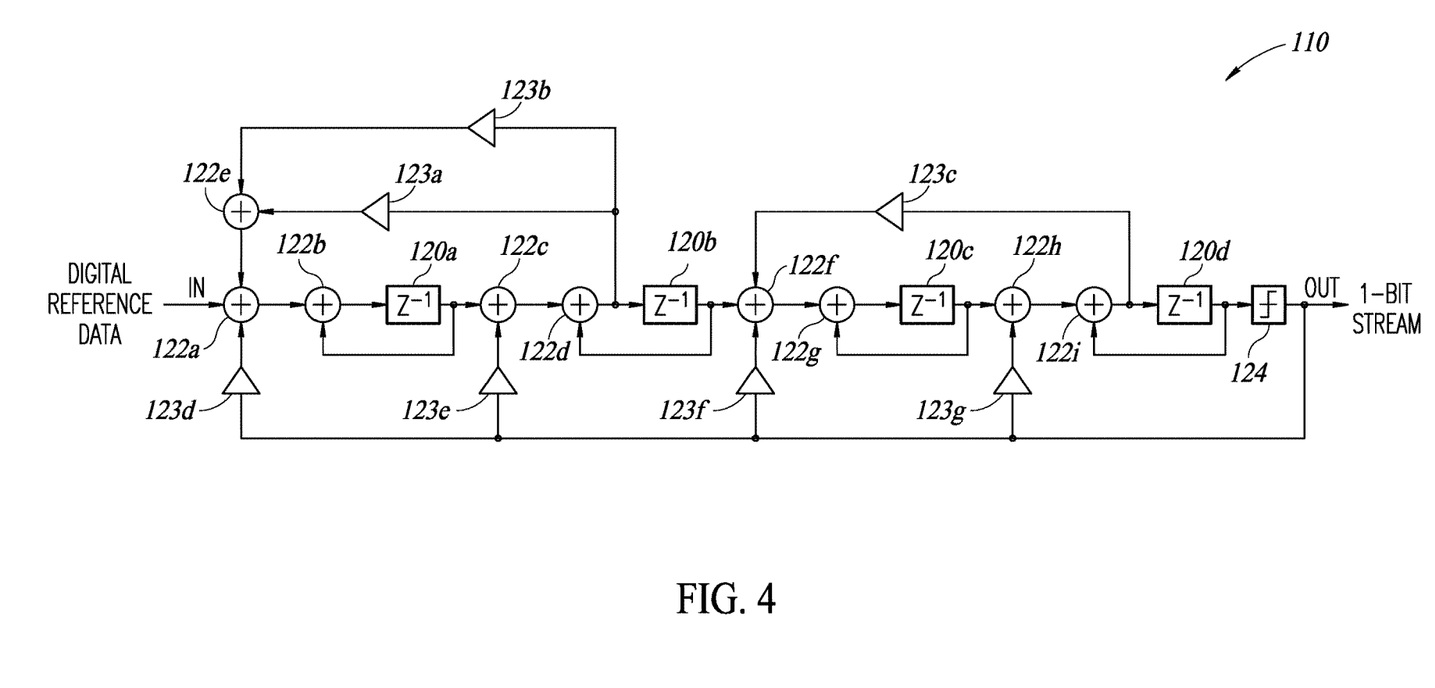
FIG. 4 is a schematic diagram of a digital modulator of a test circuit, according to one embodiment.

FIG. 4 is a schematic diagram of the digital modulator 110 of FIG. 2, according to one embodiment. The digital modulator 110 includes an input IN that receives the digital reference data 106 from the reference memory 108. The digital modulator 110 generates a single bit digital stream from the digital reference data. The digital modulator 110 includes an output OUT that outputs the single bit digital stream.

As described previously, the digital reference data 106 has a plurality of data values 118. The digital reference data 106 represents a sampling rate that is 5-10 times or more greater than the Nyquist frequency associated with the analog reference signal. In contrast to this, the single bit digital stream output from the digital modulator 110 is a plurality of single bit data values with a bit rate that is 8-16 times or more greater than the sampling rate associated with the reference data 106.

Each value of the single bit digital stream indicates whether the data values of the digital reference data 106 are increasing or decreasing. Increasing values of the digital reference data 106 results in a data value of 1 in the single bit digital stream. Decreasing values of the digital reference data 106 results in a data value of 0 in the single bit digital stream.

In FIG. 4, the digital modulator 110 is a fourth order modulator. The digital modulator 110 includes four registers 120a-120d. The digital modulator 110 includes a first pair of summers 122a and 122b between the input IN and the first register 120a. The digital modulator 110 includes a pair of summers 122c and 122d between the first register 120a and the second register 120b. The digital modulator 110 includes a pair of summers 122f and 122g between the second register 120b and the third register 120c. The digital modulator 110 includes a pair of summers 122h and 122i between the third register 120c and the fourth register 120d. The digital modulator includes a quantizer 124 coupled to the output of the fourth register 120d. The output of the quantizer 124 is output OUT of the modulator 112. Though the components 122a-i are referred to as summers, some of them may perform difference (subtraction) operations.

The digital modulator 110 includes a summer 122e coupled between the input of the second register 120b and the summer 122a. More particularly, a first gain block 123a and a second gain block 123b are connected in parallel with each other between the input of the second register 120b and the summer 122e. The gain blocks 123a and 123b may have different gain values. The summer 122e sums the outputs of the gain blocks 123a and 123b and provides the sum to the summer 122a. Because the gain blocks 123a and 123b have different gain values, the output of 122e corresponds to a time average of the input of the second register 120b. The digital modulator 110 includes a gain block123c coupled between the input of the fourth register 120d and the summer 122f. The digital modulator 110 includes four gain blocks 123d-123g having their inputs connected to the output of the quantizer 124. The output of the gain block123d is coupled to the summer 122a. The output of the gain block123e is coupled to the summer 122c. The output of the gain block123f is connected to the summer 122f. The output of the gain block123g is connected to the summer 122h. Though the components 122a-i are referred to as summers, some of them may perform difference (subtraction) operations.

The summer 122a subtracts from the digital reference data the outputs of the summer 122e and the gain block 123d. The summer 122a outputs this value to the summer 122b. The summer 122b sums the output of the summer 122a and the output of the first register 120a. The summer 122b and the register 120a function as an integrator. The summer 122c subtracts from the output of the first register 120a the output of the gain block 123e and provides the value to the summer 122d. The summer 122d sums the output of the summer 122c and the output of the second register 120b. The summer 122d and the register 120b function as an integrator. The summer 122f subtracts from the output of the second register 120b the output of the gain block 123f and provides the value to the summer 122g. The summer 122g sums the output of the summer 122f and the output of the third register 120c. The summer 122g and the third register 120c function as an integrator. The summer 122h subtracts from the output of the third register 120c the output of the gain block 123g and provides the value to the summer 122i. The summer 122i sums the output of the summer 122h and the output of the register 120d. The summer 122i and the register 120d function as an integrator. The quantizer 124 receives the output of the register 120d and outputs a digital value corresponding to the comparison. The output of the quantizer 124 is the one bit digital stream. Various configurations can be used for the modulator 110 without departing from the scope of the present disclosure.

Figure 5:
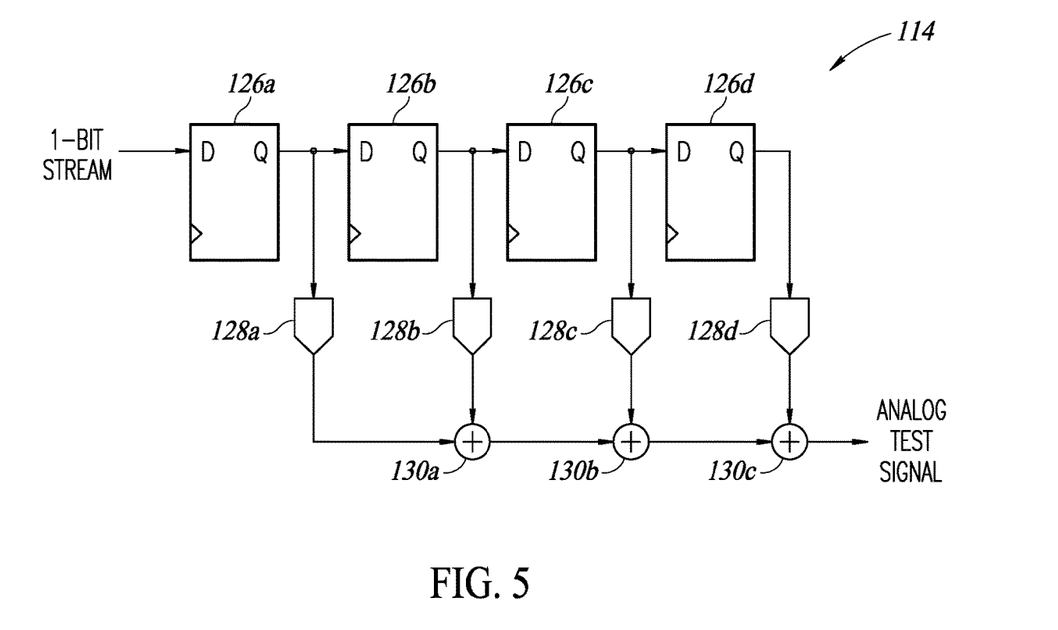
FIG. 5 is a schematic diagram of a FIR DAC, according to one embodiment.

FIG. 5 is a schematic diagram of the FIR DAC 114 of FIG. 2, according to one embodiment. The FIR DAC 114 receives the single bit digital stream from the digital modulator 110 and outputs the analog test signal.

The FIR DAC 114 includes four flip-flops 126a-126d connected in series. Though not shown in FIG. 5, each of the flip-flops 126a-126d receives a common clock signal. The data input of the first flip-flop receives the single bit digital stream. The data output of the first flip-flop 126a is coupled to the data input of the second flip-flop 126b. The data output of the second flip-flop 126b is coupled to the data input of the third flip-flop 126c. The data output of the third flip-flop 126c is coupled to the data input of the fourth flip-flop 126d.

When the first bit of the digital stream is received by the first flip-flop 126a, the value of the first bit will appear at the data output of the first flip-flop 126a and, correspondingly, at the data input of the second flip-flop 126b at the next rising edge of the clock signal. With each subsequent clock cycle, the value of the first bit of the digital stream is pushed to the output of the next flip-flop. Accordingly, the data values of the digital stream are propagated through the chain of flip-flops 126a-126d. In any given moment in time, the data value at the output of the first flip-flop 126a is one data value ahead of the data value at the output of the second flip-flop 126b. The data value at the output of the second flip-flop 126b is one data value ahead of the data value at the output of the third flip-flop 126c. The data value at the output of the third flip-flop 126c is one data value ahead of the data value at the output of the fourth flip-flop 126d. The data value at the first flip-flop is three data values ahead of the data value at the output of the fourth flip-flop 126d.

The FIR DAC 114 also includes four single bit DACs 128a-128d. Each of the single bit DACs 128a-128d is connected to the output of a respective flip-flop 126a-126d. The input of the DAC 128a is connected to the output of the flip-flop 126a. The input of the DAC 128b is connected to the output of the flip-flop 126b. The input of the DAC 128c is connected to the output of the flip-flop 126c. The input of the DAC 128d is connected to the output of the flip-flop 126d. Each DAC 128a-128d converts the digital output of the corresponding flip-flop 126a-126d to an analog signal.

The FIR DAC 114 also includes summers 130a-130c. The inputs of the summer 130a are connected to the outputs of the DACs 128a and 128b. The inputs of the summer 130b are connected to the output of the summer 130a and the output of the DAC 128c. The inputs of the summer 130c are connected to the output of the summer 130b and the output of the DAC 128d. The summer 130a sums the outputs of the DACs 128a and 128b. The summer 130b sums the output of the summer 130a and the output of the DAC 128c. The summer 130c sums the output of the summer 130b and the output of the DAC 128d. The output of the summer 130c is the analog test signal.

The summers 130a-130c provide a sort of average of the most recent three bits of the digital stream. The sum or average of the three bits will change more slowly than will any individual bit. Because of this, the FIR DAC 114 acts as a type of low-pass filter.

High-frequency fluctuations are filtered out due to the summing. Low-frequency fluctuations are passed through to the analog test signal. Returning to the example in which the digital reference data represents a sine wave with a frequency of about 5 MHz and the single bit digital stream has a bit rate greater than 1 GHz, the output of the FIR DAC 114 retains the signature of the original analog reference signal sine wave but filters out higher frequency noise and fluctuations.

FIG. 5 illustrates four flip-flops 126a-126d, four single bit DACs 128a-128d, and three summers 130a-130c. In practice, the FIR DAC 114 may include many more flip-flops than four. The FIR DAC may include between 5 and 20 flip-flops and corresponding numbers of single bit DACs and summers. If there are m flip-flops, then there will be m single bit DACs, and m-1 summers. Other configurations of numbers of components for a FIR DAC 114 may be utilized without departing from the scope of the present disclosure.

Figure 6:
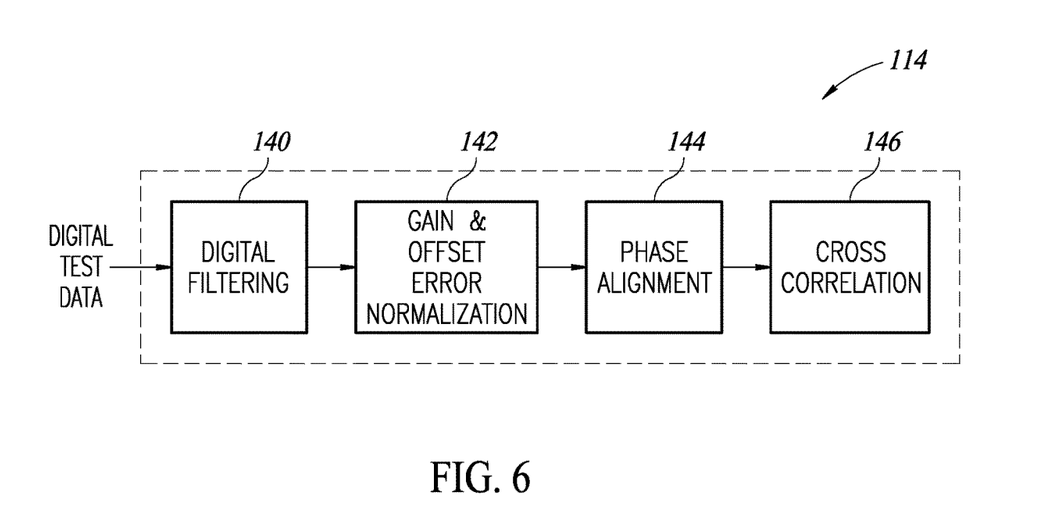
FIG. 6 is a block diagram of a digital signal processor, according to one embodiment.

FIG. 6 is a block diagram of the DSP 116 of FIG. 2, according to one embodiment. The DSP 116 includes a digital filtering block 140, a gain and offset error normalization blocks 142, a phase alignment block 144, and the cross correlation block 146. The DSP 116 receives the digital test data from the CTDS ADC 102 and determines the accuracy of the CTDS ADC 102.

The digital filtering block 140 is a low-pass filter that filters out high-frequency digital noise in the digital test data. This helps to ensure that the digital reference data can be accurately compared to the digital reference data 106.

The gain and offset error normalization block 142 normalizes the gain and offset of the digital test data. The digital test data may have a gain associated with the CTDS ADC 102. The digital test data may also have an offset associated with the CTDS ADC 102. The gain and offset normalization block 142 normalizes the error associated with the gain and offset. This assists in determining the accuracy of the CTDS ADC 102.

The phase alignment block 144 aligns the phases of the digital test data and the digital reference data 106. As the digital test data and the digital reference data 106 both are representations of an original analog sine wave, it is possible that they will be out of phase with each other. Accordingly, before the digital test data and the digital reference data 106 can be compared, the phase alignment block 144 aligns the phases of the digital test data in the digital reference data 106.

The cross correlation block 146 compares the digital test data to the digital reference data 106. This comparison gives an indication of the accuracy of the CTDS ADC 102. Ideally, the digital test data will match the digital reference data 106. However, in practice, even a very accurate CTDS ADC 102 may produce variations relative to the digital reference data 106. Accordingly, the CTDS ADC 102 may be considered accurate if the digital test data matches the digital reference data 90% or better, though other standards can be utilized without departing from the scope of the present disclosure.

The CTDS ADC 102 may have the same number of bits as the data values of the digital reference data 106. For example, if each data value 118 of the digital reference data 106 has 12 bits, then the CTDS ADC 102 may also have 12 bits. Alternatively, the CTDS ADC 102 may have a different number of bits that the data values 118 of the digital reference data 106. For example, the CTDS ADC 102 may have 10 bits. Other number of bits can be utilized without departing from the scope of the present disclosure.

Figure 7:
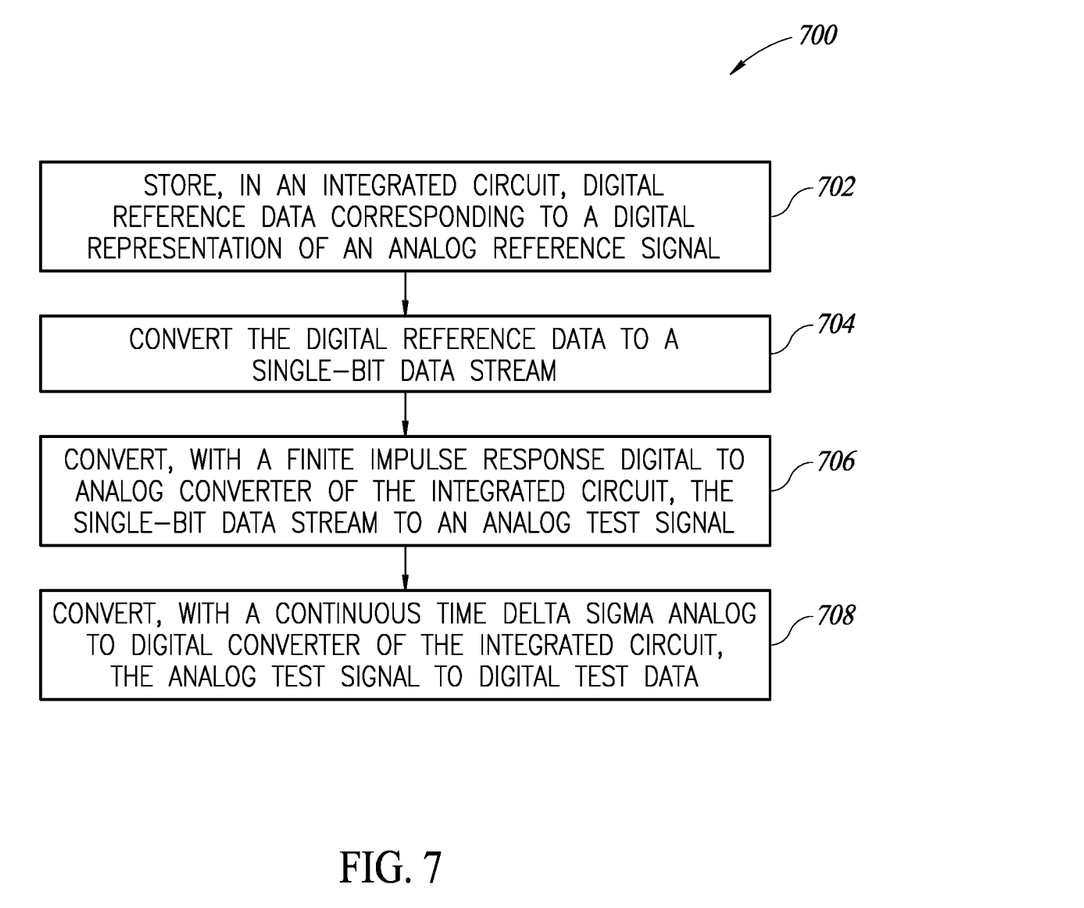
FIG. 7 is a flow diagram of a method for operating an integrated circuit, according to one embodiment.

FIG. 7 is a flow diagram of a method 700 for testing an ADC, according to one embodiment. At 702, the method 700 includes storing, in an integrated circuit, digital reference data corresponding to a digital representation of an analog reference signal. At 704, the method 700 includes converting the digital reference data to a single bit data stream. At 706, the method 700 includes converting, with a finite impulse response digital-to-analog converter of the integrated circuit, the single bit data stream to an analog test signal. At 708, the method 700 includes converting, with a continuous time delta sigma analog-to-digital converter of the integrated circuit, the analog test signal to digital test data.

Figure 8:
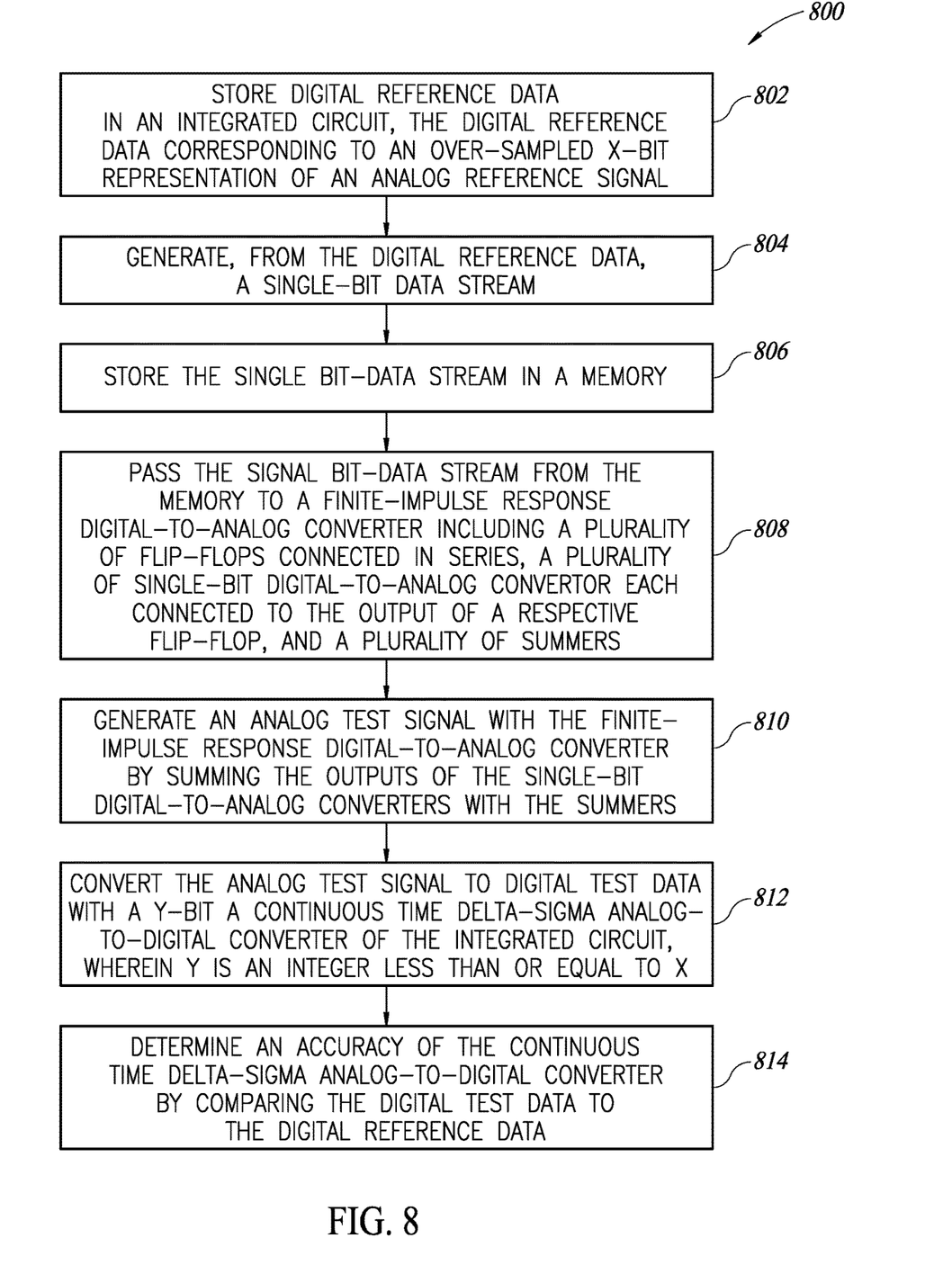
FIG. 8 is a flow diagram of a method for operating an integrated circuit, according to one embodiment.

FIG. 8 is a flow diagram of a method 800 for testing an ADC, according to one embodiment. At 802, the method 800 includes storing digital reference data in a test circuit in an integrated circuit. The digital reference data corresponds to an over-sampled X-bit representation of an analog reference signal. At 804, the method 800 includes generating, from the digital reference data, a single-bit data stream. At 806, the method 800 includes storing the single-bit data stream in a digital read only memory. At 808, the method 800 includes passing the single-bit data stream from the digital read only memory to a finite-impulse response digital-to-analog converter including a plurality of flip-flops connected in series, a plurality of single-bit digital-to-analog converters each connected to the output of a respective flip-flop, and a plurality of summers. At 810, the method 800 includes generating an analog test signal with the finite-impulse response digital-to-analog converter by summing the outputs of the single-bit digital-to-analog converters with the summers. At 812, the method 800 includes converting the analog test signal to digital test data with a Y-bit continuous time delta-sigma analog-to-digital converter of the integrated circuit, wherein Y is an integer less than or equal to X. At 814, the method 800 includes determining an accuracy of the continuous time delta-sigma analog-to-digital converter by comparing the digital test data to the digital reference data.

In one embodiment, an integrated circuit includes a test circuit. The test circuit includes a first memory configured to store digital reference data representing an analog reference signal and a modulator configured to receive the digital reference data and to convert the digital reference data to single-bit data stream. The test circuit includes a second memory configured to receive the single-bit data stream from the modulator and to store the single-bit data stream and a finite-impulse response filter configured to receive the single-bit data stream from the second memory and to convert the single-bit data stream to an analog test signal.

In one embodiment, a method includes storing, in an integrated circuit, digital reference data corresponding to a digital representation of an analog reference signal and converting the digital reference data to a single-bit data stream. The method includes converting, with a finite impulse response digital-to-analog converter of the integrated circuit, the single-bit data stream to an analog test signal and converting, with a continuous time delta sigma analog-to-digital converter of the integrated circuit, the analog test signal to a digital test data.

In one embodiment, a method includes storing digital reference data in a test circuit in an integrated circuit. The digital reference data corresponds to an over-sampled X-bit representation of an analog reference signal. The method includes generating, from the digital reference data, a single-bit data stream, storing the single-bit data stream in a digital read only memory, and passing the single-bit data stream from the digital read only memory to a finite-impulse response digital-to-analog converter including a plurality of flip-flops connected in series, a plurality of single-bit digital-to-analog converters each connected to the output of a respective flip-flop, and a plurality of summers. The method includes generating an analog test signal with the finite-impulse response digital-to-analog converter by summing the outputs of the single-bit digital-to-analog converters with the summers, converting the analog test signal to digital test data with a Y-bit continuous time delta-sigma analog-to-digital converter of the integrated circuit, wherein Y is an integer less than or equal to X, and determining an accuracy of the continuous time delta-sigma analog-to-digital converter by comparing the digital test data to the digital reference data. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a test circuit including:
      a first memory configured to store digital reference data representing an analog reference signal;
      a modulator configured to receive the digital reference data and to convert the digital reference data to single-bit data stream;
      a second memory configured to receive the single-bit data stream from the modulator and to store the single-bit data stream; and
      a finite-impulse response filter configured to receive the single-bit data stream from the second memory and to convert the single-bit data stream to an analog test signal; and
   a continuous time delta sigma analog-to-digital converter coupled to the test circuit and including:
      an input configured to receive the analog test signal from the test circuit;
      conversion circuit configured to convert the analog test signal to digital test data; and
      an output configured to output the digital test data, wherein the test circuit is configured to receive the digital test data from the continuous time delta sigma analog-to-digital converter and to assess a performance of the continuous time delta sigma analog-to-digital converter based on the digital test data.

2. The integrated circuit of claim 1, wherein the test circuit includes a digital signal processor configured to receive the digital test data and to determine an accuracy of the continuous time delta sigma analog-to-digital converter based on the digital test data.

3. The integrated circuit of claim 2, wherein the digital signal processor is configured to compare the digital test data to the digital reference data to determine the accuracy of the continuous time delta sigma analog-to-digital converter.

4. The integrated circuit of claim 1, wherein the digital reference signal represents a digitized version of the analog reference signal sampled at a frequency at least double a Nyquist frequency associated with the analog reference signal.

5. The integrated circuit of claim 4, wherein the analog test signal corresponds to a recreation of the analog reference signal.

6. The integrated circuit of claim 4, wherein the analog reference signal is a sine wave.

7. The integrated circuit of claim 4, wherein each sample of the digital reference signal is a multibit data value, wherein a bit rate of the single bit data stream is at least 10 times greater than a frequency of the analog reference signal.

8. The integrated circuit of claim 7, wherein the frequency of the analog reference signal is less than 100 MHz and the bit rate is greater than 1 Gb/s.

9. The integrated circuit of claim 1, wherein the finite impulse response filter includes a plurality of single bit digital-to-analog converters.

10. The integrated circuit of claim 9, wherein the finite impulse response filter includes a plurality of flip flops connected in series, wherein each single-bit digital-to-analog converter has an input coupled to a data output of a respective flip-flop.

11. The integrated circuit of claim 10, wherein the single-bit data stream is passed to the flip flops.

12. The integrated circuit of claim 11, wherein the finite impulse response digital-to-analog converter includes a plurality of summers that collectively sum analog output values of the single-bit digital-to-analog converters to generate the analog test signal.

13. A method, comprising:
storing, in an integrated circuit, digital reference data corresponding to a digital representation of an analog reference signal;
converting the digital reference data to a single-bit data stream;
converting, with a finite impulse response digital-to-analog converter of the integrated circuit, the single-bit data stream to an analog test signal; and
converting, with a continuous time delta sigma analog-to-digital converter of the integrated circuit, the analog test signal to digital test data; and
determining an accuracy of the digital test data with a test circuit of the integrated circuit, wherein determining the accuracy includes processing the digital test data with a digital signal processor of the test circuit.

14. The method of claim 13, wherein determining the accuracy includes comparing the digital test data to the digital reference data.

15. The method of claim 14, wherein comparing the digital test data to the digital reference data includes:
digitally filtering the digital test data;
performing gain and offset normalization of the digital test data;
aligning a phase of the digital test data with a phase of the digital reference data; and
cross-correlating the digital test data with the digital reference data.

16. The method of claim 13, wherein converting the single-bit data stream to the analog test signal includes:
passing the single-bit data stream through a plurality of flip-flops connected in series;
converting an output of each flip flop to an analog value with a respective single-bit digital-to-analog converter; and
generating the analog test signal by summing the analog values output by each single-bit digital-to-analog converter.

17. A method, comprising:
storing digital reference data in an integrated circuit, the digital reference data corresponding to an over-sampled X-bit representation of an analog reference signal;
generating, from the digital reference data, a single-bit data stream;
storing the single-bit data stream in a memory;
passing the single-bit data stream from the memory to a finite-impulse response digital-to-analog converter including a plurality of flip-flops coupled in series, a plurality of single-bit digital-to-analog converters each coupled to an output of a respective flip-flop, and a plurality of summers;
generating an analog test signal with the finite-impulse response digital-to-analog converter by summing outputs of the single-bit digital-to-analog converters with the summers;
converting the analog test signal to digital test data with a Y-bit continuous time delta-sigma analog-to-digital converter of the integrated circuit, wherein Y is an integer less than or equal to X; and
determining an accuracy of the continuous time delta-sigma analog-to-digital converter by comparing the digital test data to the digital reference data.

18. The method of claim 17, further comprising determining the accuracy with a digital signal processor of a test circuit.

19. The method of claim 17, further comprising generating the digital reference data by sampling the analog reference signal with a frequency at least double a Nyquist frequency associated with the analog reference signal.

20. The method of claim 13, further comprising generating the digital reference data by sampling the analog reference signal with a frequency at least double a Nyquist frequency associated with the analog reference signal.

21. The method of claim 17, wherein the analog test signal corresponds to a recreation of the analog reference signal.

22. The method of claim 17, wherein the analog reference signal is a sine wave.

* * * * *

UNITED STATES PATENT AND TRADEMARK OFFICE
CERTIFICATE OF CORRECTION

| | | |
|---|---|---|
| PATENT NO. | : 11,901,919 B2 | Page 1 of 1 |
| APPLICATION NO. | : 17/723225 | |
| DATED | : February 13, 2024 | |
| INVENTOR(S) | : Ankur Bal et al. | |

It is certified that error appears in the above-identified patent and that said Letters Patent is hereby corrected as shown below:

In the Claims

Column 12, Claim 1, Line 33:
"conversion circuit configured" should read: --conversion circuitry configured--.

Signed and Sealed this
Twenty-first Day of May, 2024

Katherine Kelly Vidal
*Director of the United States Patent and Trademark Office*